United States Patent [19]

Hiroki

[11] Patent Number: 5,509,771
[45] Date of Patent: Apr. 23, 1996

[54] VACUUM PROCESSING APPARATUS

[75] Inventor: Tutomu Hiroki, Yamanashi, Japan

[73] Assignees: Tokyo Electron Limited, Tokyo; Tokyo Electron Yamanashi Limited, Nirasaki, both of Japan

[21] Appl. No.: 102,987

[22] Filed: Jul. 28, 1993

[30] Foreign Application Priority Data

Jul. 29, 1992 [JP] Japan .................................... 4-222128

[51] Int. Cl.$^6$ ............................ B65G 49/07; B65H 1/00; B65H 9/00
[52] U.S. Cl. ........................ 414/217; 414/416; 414/936; 414/937; 414/939
[58] Field of Search .......................... 156/345; 414/939, 414/217, 222, 416, 935–937, 225, 744.5; 118/719; 204/298.25, 298.35

[56] References Cited

U.S. PATENT DOCUMENTS

| | | | |
|---|---|---|---|
| 4,412,771 | 11/1983 | Gerlach et al. | 414/939 X |
| 4,601,627 | 7/1986 | Oka et al. | 414/939 X |
| 4,892,455 | 1/1990 | Hine | 414/936 X |
| 5,215,420 | 6/1993 | Hughes et al. | 414/939 X |

FOREIGN PATENT DOCUMENTS 5243366  9/1993  Japan .

OTHER PUBLICATIONS

PCT document WO91/04213, Apr. 4, 1991, Wong et al.

*Primary Examiner*—Adrienne C. Johnstone
*Attorney, Agent, or Firm*—Oblon, Spivak, McClelland, Maier & Neustadt

[57]     ABSTRACT

A vacuum processing apparatus in which LCD substrates are processed includes three process chambers. Each of the process chambers is connected to a first load lock chamber through a gate valve. A second load lock chamber is also connected to the first load lock chamber through a gate valve. The second load lock chamber is opposed to a carrier member, which is arranged in the atmosphere, through a gate valve. A carrier arm is arranged in the first load lock chamber to carry the substrates between each of the process chambers and the second load lock chamber. A buffer rack for supporting two substrates thereon and positioners for aligning the two substrates, which are supported on the buffer rack, simultaneously are arranged in the second load lock chamber.

23 Claims, 7 Drawing Sheets

VACUUM PROCESSING APPARATUS

BACKGROUND OF THE INVENTION

1. Field of the Invention

The present invention relates to a vacuum processing apparatus and more particularly, an improvement of the load lock chamber used in the LCD substrate processing apparatus.

2. Description of the Related Art

Vacuum processing apparatuses provided with plural process chambers, in which predetermined processes such as etching and ashing are applied to semiconductor wafers and liquid crystal device (LCD) substrates, have been used in the course of manufacturing semiconductor devices and LCDs.

In the case of these vacuum processing apparatuses, three vacuum process chambers, for example, are arranged around an auxiliary vacuum chamber (or load lock chamber) in which a substrate carrier mechanism, such as a carrier arm, is arranged. LCD substrates, for example, which are to be processed, are carried into and out of the process; chambers by the carrier arm and predetermined processes are applied to them in these process chambers.

In the case of the vacuum processing apparatus in which LCD substrates are processed, it is an important technical problem as to how many sheets of substrates can be processed over a certain period of time or how the throughput of the apparatus can be enhanced. In addition, LCDs have been used as display devices for large-sized computers and televisions and they therefore become larger in size for this purpose. As they become larger in size, however, the productivity of LCD substrates is reduced and the manufacturing cost per LCD substrate is increased to a greater extent.

One of the causes of a reduction in productivity as described above resides in the fact that contamination is caused by contamination such as particles located in the apparatus. In addition, the shifting of LCD substrates from their predetermined positions is another cause of contamination. When they are shifted from their predetermined positions, they are dropped and damaged while they are being carried, or uniform performance of the process applied to them is degraded. Productivity is thus reduced. Particularly when they are larger in size, they are more likely to be moved by the vacuum-generating exhaust of the load lock chamber, for example. They are thus shifted from their predetermined positions.

Further, LCD substrates are of various sizes and there are various processes applied to these LCD substrates. The vacuum processing apparatus, therefore, must be made more flexible to meet these various sizes and processes.

SUMMARY OF THE INVENTION

An object of the present invention is therefore to increase the throughput of the vacuum processing apparatus to a greater extent.

Another object of the present invention is to enhance the flexibility of the vacuum processing apparatus to a greater extent.

According to a first aspect of the present invention, there is provided a vacuum processing apparatus comprising: a process chamber in which a substrate to be processed is processed under a vacuum atmosphere; a first load lock chamber connected to the process chamber through a gate valve; a second load lock chamber connected to the first load lock chamber through the gate valve; a transfer mechanism arranged in the first load lock chamber to transfer the substrate between the process chamber and the second load lock chamber through the first load lock chamber; a buffer rack arranged in the second load lock chamber to stack a plurality of substrates with a predetermined interval interposed between two adjacent substrates; and a positioning mechanism arranged in the second load lock chamber to align the substrates supported together on the buffer rack simultaneously.

According to a second aspect of the present invention, there is provided a vacuum processing apparatus comprising: a process chamber in which a substrate to be processed is processed under a vacuum atmosphere; a load lock chamber connected to the process chamber through a gate valve; a buffer rack arranged in the load lock chamber to stack a plurality of substrates with a predetermined interval interposed between two adjacent substrates; a first transfer mechanism arranged in the load lock chamber to transfer the substrates between the process chamber and the buffer rack; a positioning mechanism arranged in the load lock chamber to simultaneously align the substrates supported on the buffer rack; a support mechanism arranged outside the load lock chamber to support a cassette in which a plurality of substrates are stacked with an interval interposed between two adjacent substrates; a second transfer mechanism arranged outside the load lock chamber to transfer the substrates between the cassette supported on the support mechanism and the buffer rack, and gate valves arranged on the load lock chamber between the buffer rack and the second transfer mechanism.

Additional objects and advantages of the invention will be set forth in the description which follows, and in part will be obvious from the description, or may be learned by practicing the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DESCRIPTION OF THE PREFERRED EMBODIMENTS

The present invention will now be described in detail, citing an embodiment shown in the accompanying drawings. The present invention is applied, in this case, to the vacuum processing apparatus in which etching and ashing are applied to LCD substrates.

Figure 1:
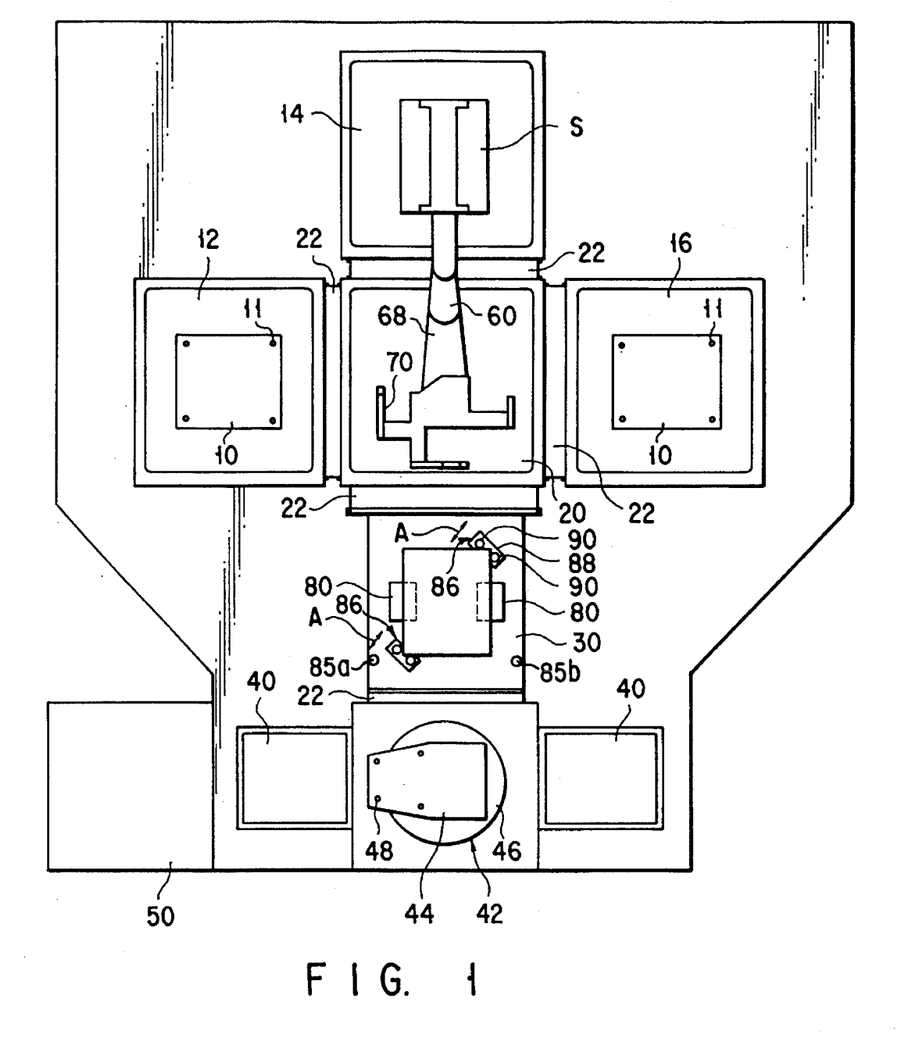
FIG. 1 is a plan view schematically showing the vacuum processing apparatus according to an embodiment of the present invention.

In the case of the vacuum processing apparatus according to an embodiment of the present invention shown in FIG. 1, a first load lock chamber (or auxiliary vacuum chamber) 20 and a second load lock chamber 30 are arranged side by side. A plurality or three vacuum process chambers, that is, first, second and third vacuum process chambers 12, 14 and 16 are arranged adjacent the remaining three sides of the first load lock chamber 20. Gate valves 22 are interposed between the first 20 and the second load lock chamber 30 and between the first load lock chamber 20 and each of the process chambers 12, 14 and 16. A gate valve 22 is also attached to an opening of the second load lock chamber 30 through which the second load lock chamber 30 communicates with the exterior. These gate valves 22 are opened and closed, serving to air-tightly seal their corresponding passages when closed.

A mount 10 on which an LCD substrate S is mounted is arranged in each of the process chambers 12, 14 and 16. Each mount 10 includes four lifting pins 11 for supporting the substrate S.

A carrier member 42 is arranged under atmospheric pressure outside the second load lock chamber 30 (or below the second load lock chamber 30 in FIG. 1). Lifting tables (not shown) on which LCD substrates-housing cassettes 40 are mounted are arranged on both sides of the carrier member 42. FIG. 1 shows the cassettes 40 mounted on their corresponding lifting tables. Substrates which will be processed are housed in one of the cassettes 40 and those which have been processed are housed in the other.

The carrier member 42 includes two arms 44 piled one upon the other, and a base 46 for supporting these arms 40 to be advanced, retracted and rotated together. Four projections 48 project from the top of each arm 40 to support the substrate S thereon. Each projection 48 is a resilient member made of synthetic rubber and having a high friction factor. The substrate S supported on these projections 48 of each arm 44 can be thus prevented from shifting from its predetermined position on each arm 40 or from dropping off from it. The carrier member 42 can carry two sheets of substrates at once by its two arms 44. In short, two sheets of substrates can be carried into and out of each cassette 40 by the carrier member 42. The level of each cassette 40 can be adjusted to a substrate carrying-in or carrying-out position by the lifting table.

It is preferable that the two arms 44 of the carrier member 42 have such a distance between them as can meet any of cassettes of various kinds which have various own substrate-supporting intervals. More specifically, the distance is set between the two arms 44 such that the arms 44 can be inserted between the substrates in any of various kinds of cassettes. In addition, it is also set different than and preferably larger than the maximum value of the substrate-supporting intervals of the various cassettes. The carrier member 42 can thus be used with any cassettes which have various substrate-supporting intervals. The vacuum processing apparatus is thus made more flexible.

A cassette may be arranged on only one side of the carrier member 42. Those substrates which have been processed would be successively returned, in this case, into empty spaces in the cassette.

A CRT (cathode ray tube) 50 is arranged on one side of the carrier member 42 with the cassette-mounted table interposed between them to monitor how the processing of each substrate is controlled in the vacuum processing apparatus.

Figure 2:
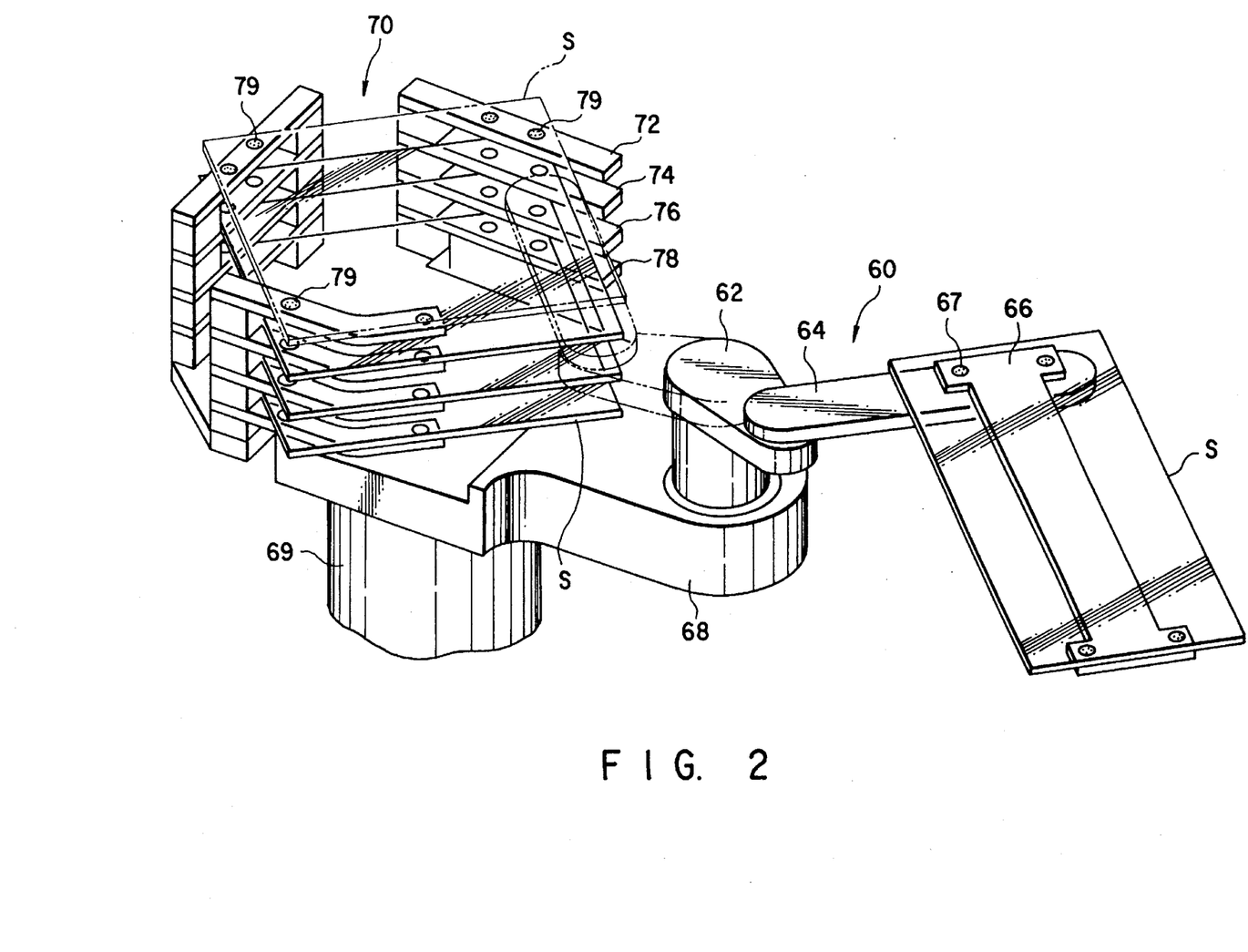
FIG. 2 is a perspective view showing a carrier arm and a buffer frame arranged in a first load lock chamber of the apparatus shown in FIG. 1.

As shown in FIG. 2, a carrier arm 60 and a buffer frame 70 are arranged so as to be capable of holding a plurality of sheets of LCD substrates are arranged in the first load lock chamber 20. Substrates are carried in and out between the first load lock chamber 20 and each of the vacuum process chambers 12, 14 and 16 by the carrier arm 60. The buffer frame 70 is used to temporarily hold processed or unprocessed LCD substrates therein to increase the throughput of the processes conducted.

The buffer frame 70 is located at one end of a rotatable base 68 and is arranged so as to be movable up and down relative to the base 68. It includes a plurality or four buffers, that is, first, second, third and fourth buffers 72, 74, 76 and 78 to form four horizontal LCD substrate support levels. Each level of buffers has protrusions 79 on which the substrate is supported, and these protrusions 79 are resilient members made of synthetic rubber and having a high friction factor. In addition, they serve to prevent the substrate thereon from shifting from its predetermined position on each level or from dropping from each level.

The carrier arm 60 is located at the other end of the base 68. It includes first, second and third swingable arm elements 62, 64 and 66 and can be thus made extensible. The third arm element 66 is shaped like letter I, as shown in FIG. 2, and has protrusions 67 at its sideward-extended portions on which the substrate S is supported. These protrusions 67 are resilient members made of synthetic rubber, have a high friction factor and serve to prevent the substrate S thereon from shifting from its predetermined position on the third arm element 66 or from dropping off from the element 66.

The carrier arm 60 and the buffer frame 70 are rotated together around a cylinder 69. When the base 68 is rotated, the arm 60 selectively faces one of the vacuum process chambers 12, 14, 16 and the second load lock chamber 30.

The carrier mechanism provided with the carrier arm 60 and the buffer frame 70 is substantially the same as that disclosed in U.S. patent application Ser. No. 08/053,389 (now U.S. Pat. No. 5,306,380) filed on Apr. 28, 1993 by the same Applicant, the teachings of which are hereby incorporated by reference.

Figure 3:
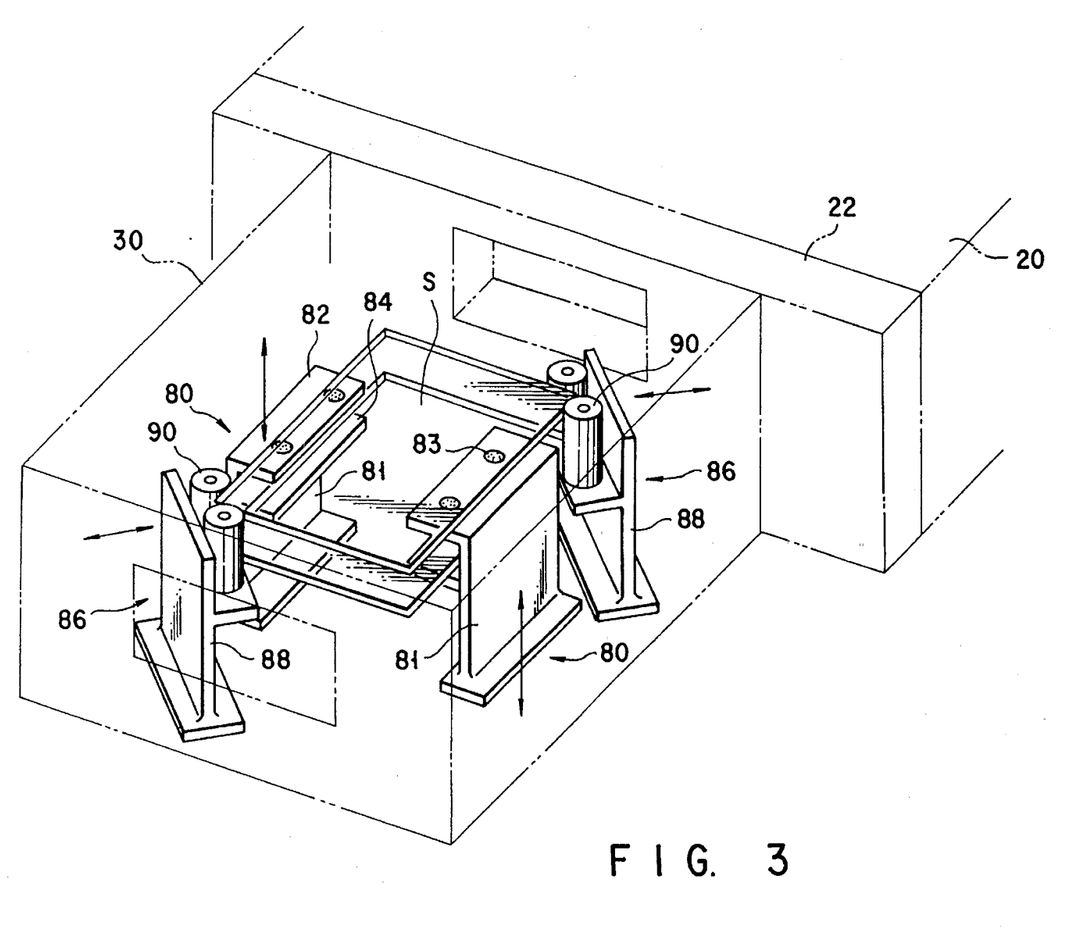
FIG. 3 is a perspective view showing a buffer rack and positioners arranged in a second load lock chamber of the apparatus shown in FIG. 1.

A buffer rack 80 having a pair of stands 81 to support LCD substrates S thereon is arranged in the second load lock chamber 30. It serves to temporarily hold two sheets of LCD substrates S together in the second load lock chamber 30. The vacuum making and purging efficiency in the second load lock chamber 30 can be enhanced by transferring two sheets of LCD substrates S simultaneously into the second load lock chamber 30 by the arms 44.

The rack 80 has two buffers, that is, fifth and sixth buffers 82 and 84, by which two horizontal substrate support levels are formed to correspond the two arms 44 of the carrier member 42 located in the atmosphere. The distance present between the two levels of the rack 80 is set different than and preferably larger than the substrate-supporting intervals of the cassettes 40. Each level of the rack 80 has protrusions 83 on which the substrate S is supported. These protrusions 83 are resilient members made of synthetic rubber for having a higher friction factor and they serve to prevent the substrate S thereon from shifting from its predetermined position on each level or dropping off from the level on which it is positioned. The stands 81 of the buffer rack 80 are moved together up and down. When the buffer rack 80 is moved up and down in this manner, one of the two substrates S supported on the rack 80 can be selectively carried out by the carrier arm 60 without moving the arm 60 up and down in the first load lock chamber 20.

A pair of positioners 86 are arranged in the second load lock chamber 30 to align two substrates simultaneously. An optical sensor comprising an emitter 85a and a receiver 85b is also arranged in the second load lock chamber 30 to confirm that the alignment of the two substrates is finished.

The positioners 86 are opposed to each other on a diagonal line of the substrate. Each positioner 86 has a base 88 movable in directions shown by arrows A in FIG. 1, and a pair of rollers 90 freely rotatably supported by the base 88. The positioners 86 align the two substrates on the rack 80 while sandwiching these substrates between them in the diagonal direction of the substrates. The rollers 90 are particularly suitable for positioning the rectangle-shaped substrates while pushing sides of each substrate at four points. They are detachably attached to the bases 88 and can be exchanged with new ones, depending upon the dimensions of LCD substrates which are to be processed.

An opening is formed in, the front roller 90 of the positioner 86 to be aligned with the emitter 85a and receiver 85b. The optical sensor detects the alignment of the substrate when light emitted from the emitter 85a passes through the opening in the front roller 90 and reaches the receiver 85b.

Figure 4:
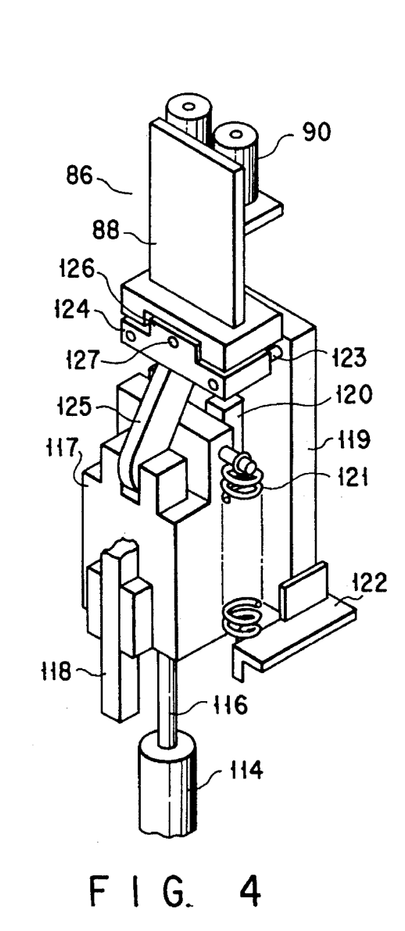
FIG. 4 is a perspective view showing a mechanism for driving each positioner shown in FIG. 3.
Figure 5A:
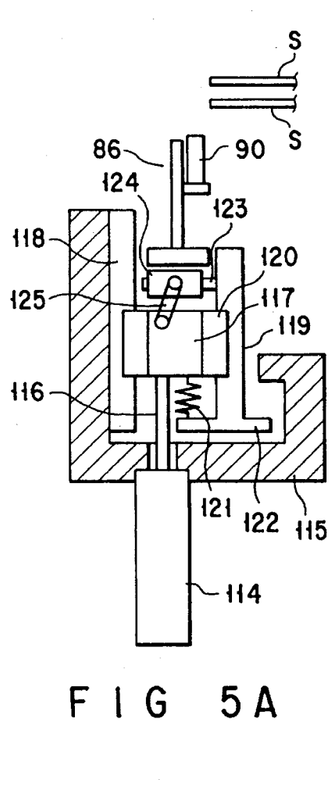
FIGS. 5A through 5C show how each positioner is driven by the drive mechanism shown in FIG. 4.
Figure 5B:
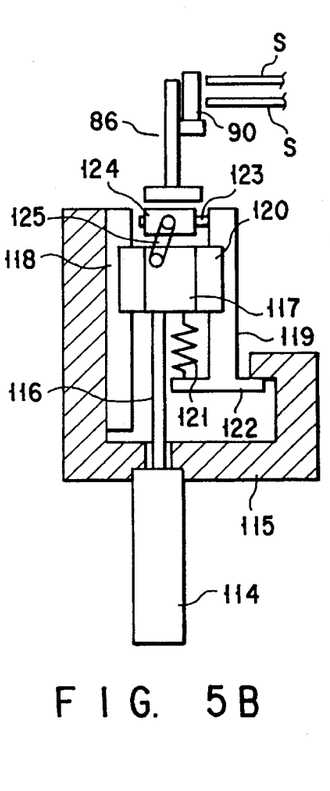
Figure 5C:
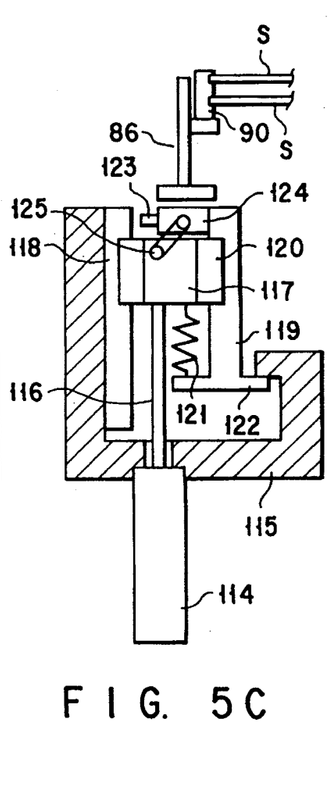

FIG. 4 shows a mechanism for driving the positioners 86 and FIGS. 5A through 5C show how the drive mechanism is operated.

Each positioner 86 is driven by a drive source or an air cylinder 114 fixed to a casing 115. A block 117 is fixed to a drive shaft 116 of the air cylinder 114 and guided up and down by a linear guide 118 attached to the casing 115.

A plate 119 is engaged with the block 117 and guided up and down by linear guides 120 attached to the block 117. A spring 121 is interposed between the block 117 and the plate 119 and when the block 117 is moved up, therefore, the plate 119 is pulled up by the block 117.

A stopper 122 is fixed to the bottom of the plate 119. When the stopper 122 is contacted with a sideward-projected portion of the casing 115, as shown in FIG. 5B, the upward movement of the plate 119 is stopped, thereby allowing only the block 117 to be moved upward along the linear guides 120 while stretching the spring 121.

A slider 124 is engaged with the plate 119 to freely slide along linear guides 123 attached to the plate 119 in a horizontal direction (or in a direction in which the LCD substrates S are pushed). The slider 124 is connected to the block 117 through a link 125. When only the block 117 is further moved upward from its position shown in FIG. 5B and the space between the slider 124 and the block 117 is thus made narrower, the slider 124 is moved in the horizontal direction by the link 125, as shown in FIG. 5C.

As shown in FIG. 4, a linear guide 126 is formed on the top of the slider 124 and the base 88 of each positioner 86 is engaged, movable in the horizontal direction, with this linear guide 126. A spring 127 is interposed between the slider 124 and the base 88. When the bases 88 are moved to push the LCD substrates S by their rollers 90, therefore, the springs 127 can prevent an excessive load from being added to the substrates S.

It may be possible that both of two positioners 86 are moved in the diagonal direction of the substrates or that one of them is moved while fixing the other in the direction.

Operation will now be described for the above-described vacuum processing apparatus according to an embodiment of the present invention.

The two arms 44 of the carrier member 42 are driven to carry two substrates S, which are to be processed, together out of the left cassette 40 in FIG. 1. They are then turned by about 90° by the base 46 to carry the two substrates S together into the second load lock chamber 30. The distance between the two substrates S is set larger than the maximum value of the substrate-supporting intervals in any of various cassettes. This enables the arms 44 of the carrier member 42 to handle any of different kinds of cassettes.

The two substrates S are held by fifth and sixth buffers 82 and 84 of the buffer rack 80 and after the arms 44 are retracted, that gate valve 22 of the second load lock chamber 30 which is located on the atmospheric side is closed. The second load lock chamber 30 is then exhausted to a predetermined vacuum or about $10^{-1}$ Torr. The substrates S are positioned while pushing them by the four rollers of the pair of positioners 86.

As described above, the positioning of the substrates is carried out in this vacuum processing apparatus after the second load lock chamber 30 is under a vacuum. Even if the substrates S are fanned by the flow of atmosphere caused at the vacuum-making time and thus moved from their predetermined positions, this movement can be effectively corrected. In a case where the substrates are large in size and are likely to be fanned by the flow of atmosphere, therefore, this is quite effective for preventing them from shifting from their predetermined positions. The positioning of the substrates may be carried out at least before they are carried into the first load lock chamber 20. It may be arranged, for example, that their alignment is carried out before the second load lock chamber 30 is under vacuum, that they are pushed by the rollers 90 while the chamber 30 is under vacuum, and that they are released from the rollers 90 after the chamber 30 is under vacuum. When arranged in this manner, they can be prevented from being moved by the flow of atmosphere, and thus being dropped and damaged when the chamber 30 is under vacuum. The positioners 86 are arranged in the second load lock chamber 30 in the above-described vacuum processing apparatus and this is because the second load lock chamber 30 is under vacuum from atmospheric pressure and the substrates are thus more likely to be fanned by the flow of atmosphere in the chamber 30 than in the first load lock chamber 20.

After the gate valve 22 between the first 20 and the second load lock chamber 30 is opened, the substrates which have been positioned as described above are carried into the first load lock chamber 20 by the carrier arm 60. The substrates S are supported on the buffer rack 80 in this case, having a predetermined distance between them. In the vacuum processing apparatus according to the present, invention, the cassettes 40, whose substrate-supporting intervals may be varied, depending on every cassette, are located under atmospheric pressure, and the buffer rack 80, which can hold the substrates S with a certain distance therebetween, is arranged in the second load lock chamber 30. The operation control of the carrier arm 60 can be thus achieved without depending upon the substrate supporting intervals of the cassette 40. In short, the carrier arm 60 does not need any complicated control means by which its operation is controlled to meet any of cassettes whose substrate-supporting intervals are varied and this enables the flexibility of the apparatus to be enhanced to a greater extent. The carrier arm 60 is arranged particularly in the load lock chamber. When no complicated control means is needed, therefore, it is quite useful for reducing contamination in the apparatus.

The substrates S carried into the first load lock chamber 20 as described above are etching- or ashing-processed according to an operation routine shown in FIGS. 8A through 8J.

Figure 8A:
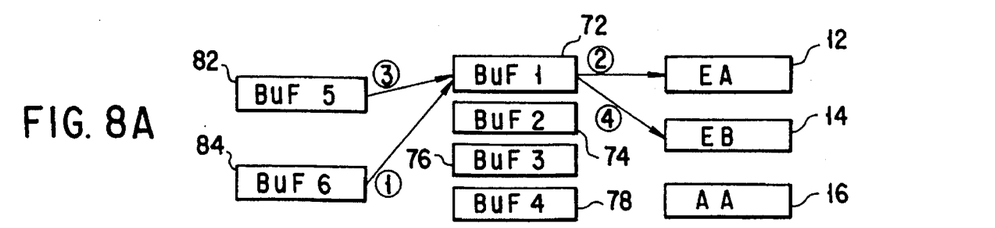
FIGS. 8A through 8J show how substrates are carried in the apparatus shown in FIG. 1.

As shown in FIG. 8A, the substrate S-1 held on the sixth buffer 84 (BUF 6) is carried into the first load lock chamber 20 and held on the first buffer 72 (BUF 1) and the gate valve 22 between the first 20 and the second load lock chamber 30 is closed (see arrow 1). The reason why the substrate S-1 is picked up not from the fifth buffer 82 (BUF 5) but from the BUF 6 is that the other substrate S-2 which is located above the one S-1 can be effectively prevented from being contaminated even if the substrate S-1 is contacted with any of mechanical components and contaminating matter such as particles are thus caused when the substrate S-1 is being carried. The reason why the unprocessed substrate S-1 is held on the uppermost BUF 1 is that it may be contaminated by contaminating matter caused by the other now-processing or already processed substrate when this now-processing or already processed substrate is located above it.

The first load lock chamber 20 is then under a vacuum of $10^{-4}$ Torr. This enables processing contamination to be reduced in the apparatus. The gate valve 22 located on the side of the first vacuum process chamber 12 is opened and the substrate S-1 on the BUF 1 is carried into the chamber 12 (EA) (see arrow 2) where the etching process is carried out on the substrate S-1. The other substrate S-2 held on the BUF 5 is similarly carried into the second vacuum process chamber 14 (EB) (see arrows 3 and 4) where etching process is carried out on the substrate S-2. While etching the substrates S-1 and S-2, new unprocessed substrates S-3 and S-4 are carried from the cassette 40 and held on the BUFs 5 and 6.

Figure 8B:
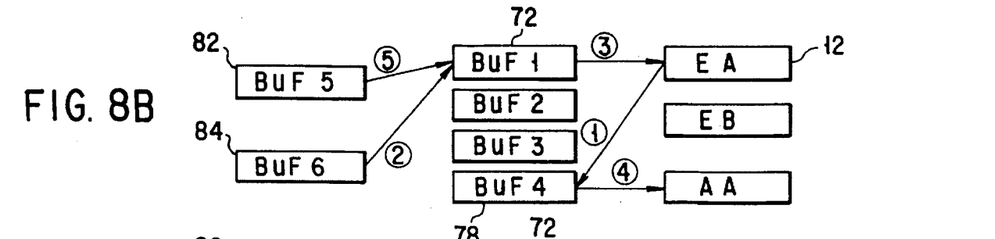

As shown in FIG. 8B, the substrate S-1 which has been etched in the EA is held on the fourth buffer 78 (BUF 4) (see arrow 1). In order to reduce process contamination as described above, the processed substrate S-1 is held on the lowermost buffer (BUF 4) in the vacuum processing apparatus according to the present invention. The substrate S-3 held on the BUF 6 is then carried into the EA (see arrows 2 and 3) where it is etched. The substrate S-1 on the BUF 4 is carried into the third vacuum processing chamber 16 (AA) (see arrow 4) where it is ash-processed. The reason why the etched substrate S-1 is carried into the AA after the unprocessed substrate S-3 on the BUF 6 is carried into the EA is due to the fact that the time for etching (two minutes, for example) is usually longer than the time of ashing process (one minute, for example). When the buffer frame 70 is made to have plurality of substrate support levels as seen in the vacuum processing apparatus according to the present invention, the processes can be made more efficient and their throughput can be enhanced to a greater extent as described above. The substrate S-4 on the BUF 5 is then carried onto BUF 1 (see arrow 5) and new unprocessed substrates S-5 and S-6 are held on BUFs 5 and 6.

Figure 8C:
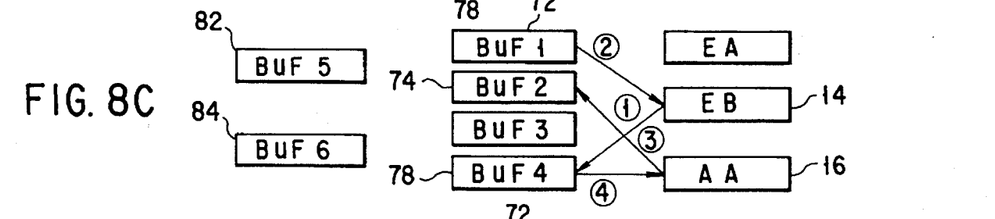

As shown in FIG. 8C, the substrate S-2 which has been processed in the EB is carried onto the BUF 4 (see arrow 1) and the substrate S-4 on the BUF1 is then carried into the EB (see arrow 2) while keeping the gate valve 22 open. The substrate S-1 which has been ash-processed in the AA is carried onto the BUF 2 (see arrow 3) and the substrate S-2 on the BUF 4 is carried into the AA while similarly keeping the gate valve 22 open (see arrow 4). As described above, the vacuum processing apparatus includes a plurality of buffers, that is, the BUF 1 on which the unprocessed substrate is held, the BUF 4 on which the etched substrate is held, and the BUFs 2 and 3 on which the ashed substrates are held.

The processed and unprocessed substrates can therefore be successively carried out in one of the process chambers while leaving the gate valve open. This enables the throughput of processes to be enhanced to a greater extent. Further, process contamination can be reduced to a greater extent and the productivity of substrates can be thus enhanced because the unprocessed substrate is held above the processed one in the vacuum processing apparatus.

Figure 8D:
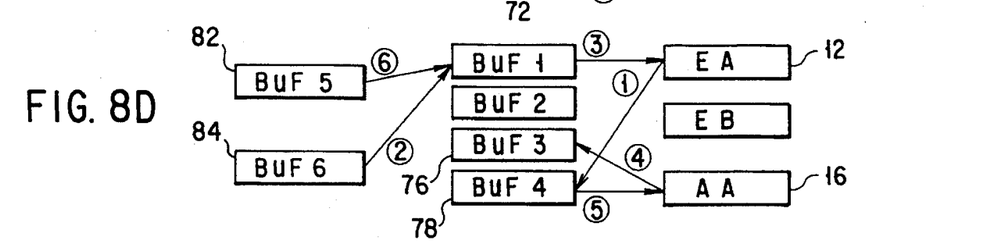

As shown in FIG. 8D, the ashing process of the substrate S-2 is finished after the substrate S-2 is processed in the order of arrows 1, 2, 3, 4, 5 and 6, and the processing of the new substrates S-5 and S-6 is started.

Figure 8E:
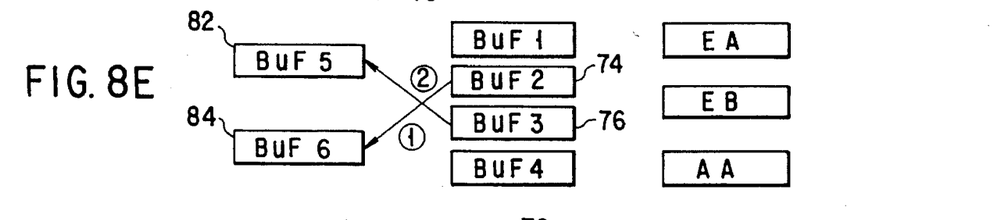
Figure 8F:
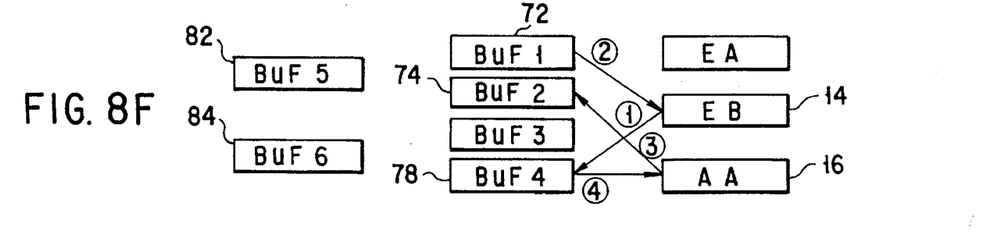
Figure 8G:
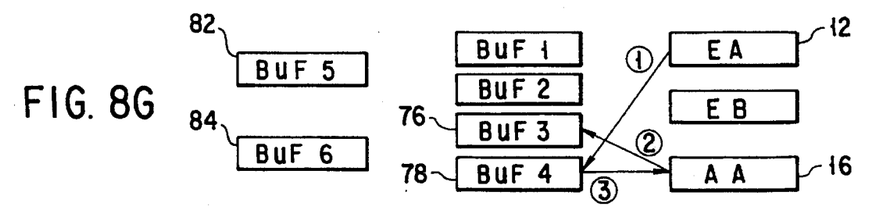
Figure 8H:
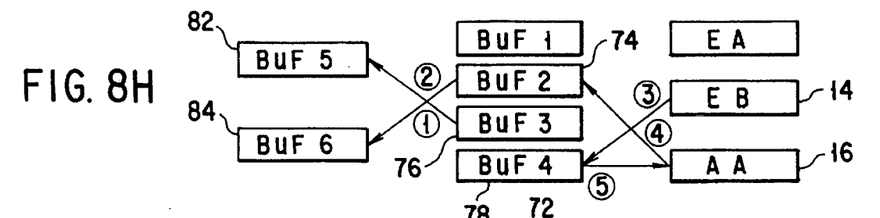
Figure 8I:
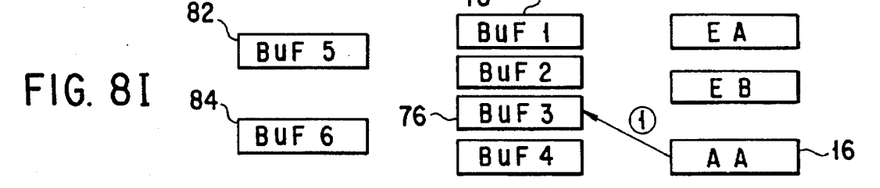
Figure 8J:
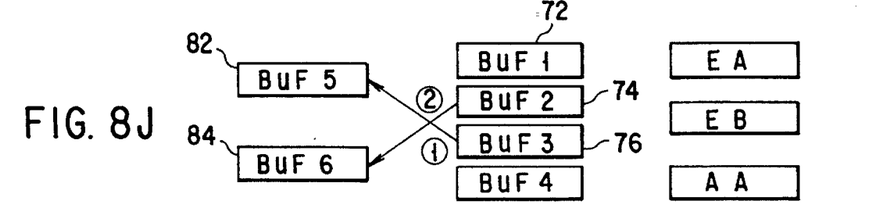

As shown in FIG. 8E, the substrates S-1 and S-2 are carried onto the BUFs 6 and 5. In order also to prevent the substrates from being contaminated in this case, the substrate S-2 is carried out of the lower BUF 3 and onto the upper BUF 5 (see arrow 1) and the substrate S-1 is then carried out of the upper BUF 2 and onto the lower BUF 6 (see arrow 2). They are thereafter carried into the right cassette 40 in FIG. 1.

The substrates S-3, S-4, S-5 and so on are successively processed following arrows 1, 2, 3, 4 and 5 in FIGS. 8F through 8J. Fourteen sheets of substrates, for example, housed in the left cassette 40 in FIG. 1 are processed in the same manner and the operation routine is thus finished in the vacuum processing apparatus.

According to the vacuum processing apparatus, the operation routine can be more efficiently achieved in such a way that 500 sheets of LCD substrates per day are successively etched and ashed. Further, process contamination can be reduced and the productivity of substrates can be enhanced although the throughput of processes is much higher.

According to the vacuum processing apparatus, etching and ashing processes, the single process of etching or other various processes can be successively achieved to meet any needs of users when the control program is changed. The vacuum processing apparatus can be thus made much more flexible.

It should be understood that the present invention is not limited to the above described apparatus and that various changes and modifications can be made without departing from the spirit and scope of the present invention.

Figure 6A:
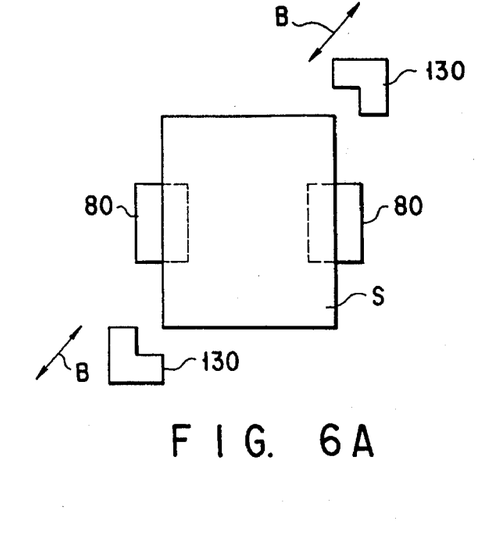
FIGS. 6A and 6B are plan views showing variations of the positioner.
Figure 6B:
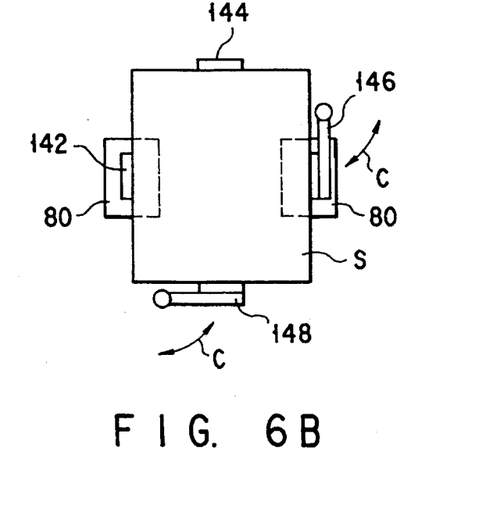

Variations shown in FIGS. 6A and 6B, for example, can be used as the positioners in the second load lock chamber 30 to position both of two substrates.

In FIG. 6A, a pair of positioners 130 are made freely movable in relation to the substrates and in the diagonal direction of the substrates. The drive mechanism for each positioner 86 shown in FIG. 4 can be used to drive each positioner 130.

In FIG. 6B, stoppers 142 and 144 are contacted with two adjacent sides of each substrate S and rotary pushers 146 and 148 with the other two adjacent sides thereof. The stopper 142 and the pusher 146 are fixed while the stopper 144 and the pusher 148 are arranged freely movable up and down so as not to interfere with the substrates S.

Figure 7:
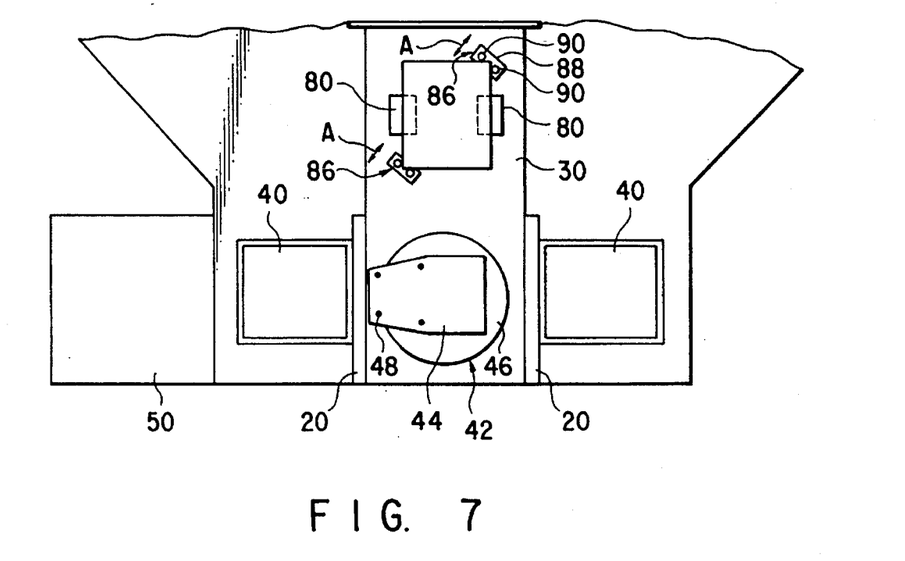
FIG. 7 shows a variation of the second load lock chamber.

As shown in FIG. 7 the carrier member 42 for carrying the substrates into and out of the cassettes 40 can be arranged in the second load lock chamber 30. The carrier member 42 and the buffer rack 80 are held in the same atmosphere and gate valves 20 are interposed between the chamber 30 and one cassette 40 and between the chamber 30 and the other cassette 40 in this case.

The present invention can be effectively applied to the vacuum processing apparatus which is provided with a single vacuum process chamber. It can also be applied to other various vacuum processing apparatuses, such as a film forming apparatus, as well as the etching and ashing apparatus described above.

What is claimed is:

1. A vacuum processing apparatus comprising:
   a process chamber in which a substrate is processed under a vacuum atmosphere;
   a first load lock chamber connected to the process chamber through a first gate valve;
   a second load lock chamber connected to the first load lock chamber through a second gate valve;
   a first transfer mechanism arranged in the first load lock chamber which transfers the substrate between the process chamber and the second load lock chamber through the first load lock chamber;
   a buffer rack arranged in the second load lock chamber to stack a plurality of substrates with an interval interposed between two adjacent substrates;
   a positioning mechanism arranged in the second load lock chamber, said positioning mechanism simultaneously aligning the substrates supported on the buffer rack;
   a table upon which a cassette is mounted in which a plurality of the substrates are stacked with an interval interposed between two adjacent substrates; and
   a second transfer mechanism transferring the substrates between the cassette mounted on the table and the buffer rack,
   wherein each of the substrates has a rectangular shape and the positioning mechanism includes first and second positioners movable relative to each other in a diagonal direction of the substrates to sandwich the substrates between the first and second positioners, and
   wherein the second transfer mechanism supports and transfers the substrates, which are supported together on the buffer rack, simultaneously with an interval interposed between two adjacent substrates.

2. The apparatus according to claim 1, wherein the first and second positioners resiliently sandwich the substrates there between.

3. The apparatus according to claim 1, wherein the buffer rack is movable up and down and assists both of the first and second transfer mechanisms by which the substrates are transferred.

4. The apparatus according to claim 1, wherein the first positioner includes a first pair of rollers contacting two adjacent sides of each substrate and the second positioner includes a second pair of rollers contacting two other adjacent sides of each substrate.

5. The apparatus according to claim 1, which comprises a detecting mechanism detecting completion of alignment of the substrates wherein said detecting mechanism is located in the second load lock chamber.

6. The apparatus according to claim 1, which comprises a third gate valve wherein the second transfer mechanism is located outside the second load lock chamber and wherein said third gate valve is interposed between the buffer rack and the second transfer mechanism.

7. The apparatus according to claim 1, wherein the table comprises a lifting table adjusting the level of the cassette.

8. The apparatus according to claim 1, wherein the second transfer mechanism includes a plurality arms, each of said arms supporting a substrate thereon.

9. A vacuum processing apparatus comprising:
   first and second process chambers in each of which a substrate to be processed is positioned, said substrate having a rectangular shape, wherein said substrate is processed under a vacuum atmosphere;
   a first load lock chamber having a gate valve connected to each of the first and second process chambers;
   a second load lock chamber having a gate valve connected to the first load lock chamber;
   a first transfer mechanism arranged in the first load lock chamber, said first transfer mechanism transferring substrates located therein between the process chambers and the second load lock chamber through the first load lock chamber;
   a buffer rack arranged in the second load lock chamber, said buffer rack stacking substrates located therein with an interval interposed between two adjacent substrates;
   a positioning mechanism located in the second load lock chamber, said positioning mechanism aligning each of the substrates supported on the buffer rack simultaneously, the positioning mechanism having first and second positioners movable relative to each other in a diagonal direction of the substrates to sandwich the substrates therebetween;
   a table upon which a cassette is mounted in which substrates located therein are stacked with an interval interposed between two adjacent substrates; and
   a second transfer mechanism transferring the substrates between the cassette mounted on the table and the buffer rack, the second transfer mechanism supporting and transferring the substrates, which are supported together on the buffer rack, simultaneously with an interval interposed between two adjacent substrates.

10. The apparatus according to claim 9, wherein the table comprises a lifting table adjusting the level of the cassette.

11. The apparatus according to claim 9, wherein the first and second positioners resiliently sandwich the substrates therebetween.

12. The apparatus according to claim 9, wherein the second transfer mechanism includes a plurality of arms each supporting a substrate thereon.

13. The apparatus according to claim 9, wherein the buffer rack is movable up and down and assists both of the first and second transfer mechanisms by which the substrates are transferred.

14. The apparatus according to claim 9, wherein the first positioner includes a first pair of rollers contacting two adjacent sides of each substrate and the second positioner includes a second pair of rollers contacting two other adjacent sides of each substrate.

15. The apparatus according to claim 9, which comprises a detecting mechanism detecting completion of alignment of the substrates wherein said detecting mechanism is located in the second load lock chamber.

16. The apparatus according to claim 9, wherein the second transfer mechanism is located outside the second load lock chamber and a gate valve is interposed between the buffer rack and the second transfer mechanism.

17. A vacuum processing apparatus comprising:
   a process chamber in which a substrate to be processed, having a rectangular shape, is processed under a vacuum atmosphere;
   a first load lock chamber having a first gate valve connected to the process chamber;
   a second load lock chamber having a second gate valve connected to the first load lock chamber;
   a first transfer mechanism arranged in the first load lock chamber and transferring substrates located therein between the process chamber and the second load lock chamber through the first load lock chamber;

a buffer rack arranged in the second load lock chamber, said buffer rack stacking two or more substrates located therein with an interval interposed between two adjacent substrates;

a positioning mechanism arranged in the second load lock chamber and aligning the substrates supported on the buffer rack simultaneously, the positioning mechanism having first and second positioners movable relative to each other in a diagonal direction of the substrates to sandwich the substrates therebetween;

a table upon which a cassette is mounted in which a plurality of substrates are stacked with an interval interposed between two adjacent substrates; and a second transfer mechanism arranged in the second load lock chamber wherein a gate valve is provided on the second load lock chamber and interposed between the second transfer mechanism and the table, said second transfer mechanism transferring substrates between the cassette mounted on the table and the buffer rack, the second transfer mechanism supporting and transferring the substrates, which are supported together on the buffer rack, simultaneously with an interval interposed between two adjacent substrates.

18. The apparatus according to claim 17, wherein the table comprises a lifting table adjusting the level of the cassette.

19. The apparatus according to claim 17, wherein the first and second positioners resiliently sandwich the substrates therebetween.

20. The apparatus according to claim 17, wherein the second transfer mechanism includes a plurality of arms each supporting a substrate thereon.

21. The apparatus according to claims 17, wherein the buffer rack is movable up and down and assists the first and second transfer mechanisms by which the substrates are transferred.

22. The apparatus according to claim 34, wherein the first positioner includes a first pair of rollers contacting two adjacent sides of each substrate and a second positioner includes a second pair of rollers contacting two other adjacent sides of each substrate.

23. The apparatus according to claim 17, which comprises a detecting mechanism detecting completion of alignment of the substrates wherein said detecting mechanism is located in the second load lock chamber.

* * * * *